(12) United States Patent
Ikegami

(10) Patent No.: US 6,377,909 B1
(45) Date of Patent: Apr. 23, 2002

(54) METHOD AND APPARATUS FOR PREPARING A LOGIC SIMULATION MODEL AND RECORDING MEDIUM FOR STORING THE SAME

(75) Inventor: Hiroyuki Ikegami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/238,093

(22) Filed: Jan. 27, 1999

(30) Foreign Application Priority Data

Jan. 27, 1998 (JP) .......................................... 10-014185

(51) Int. Cl.[7] .......................... G06F 9/455; G06F 17/50
(52) U.S. Cl. ................................ 703/14; 703/22; 716/2; 716/18; 716/5
(58) Field of Search .............................. 703/14–16, 22; 716/4, 5, 2, 18

(56) References Cited

U.S. PATENT DOCUMENTS

| 5,673,199 A | * | 9/1997 | Gentry ........................... 703/1 |
| 5,703,789 A | * | 12/1997 | Beausang et al. ............... 716/4 |
| 5,805,861 A | * | 9/1998 | Gilbert et al. ................. 703/15 |
| 5,870,588 A | * | 2/1999 | Rompaey et al. ............. 703/13 |
| 5,872,958 A | * | 2/1999 | Worthington et al. ......... 703/13 |
| 5,963,724 A | * | 10/1999 | Mantooth et al. ............. 703/14 |
| 5,978,571 A | * | 11/1999 | Grundmann .................. 703/23 |
| 6,026,220 A | * | 2/2000 | Cleereman et al. ........... 703/23 |
| 6,026,226 A | * | 2/2000 | Heile et al. .................... 716/12 |

FOREIGN PATENT DOCUMENTS

JP  A-08-263530  10/1996
JP  A-10-340291  12/1998

OTHER PUBLICATIONS

Smith, D. R., "Hardware Synthesis from Encapsulated Verilog Modules", Proceedings of the Interational Conference on Application of Spedific Systems, Architectures and Processors, pp. 284–292, Aug. 1996.*

Harrington, B.K., "SPIL—A Program to Automatically Create ASIC Macro Models for Logic Simulation", Proc. Third Annual IEEE ASIC Seminar and Exhibit, pp. P5/5.1–5.4, Sep. 1990.*

Chow, K.W.Y., "Fully Specified Verification Simulation", International Verilog HDL Conference, pp. 22–28, Mar. 1994.*

Middelhoek et al., "From VHDL to Efficient and First–Time–Right Designs: A Formal Approach"., ACM Transactions on Design Automation, vol. 1, No. 2, pp. 205–250, Apr. 1996.*

* cited by examiner

Primary Examiner—Russell W. Frejd
(74) Attorney, Agent, or Firm—Scully, Scott, Murphy & Presser

(57) ABSTRACT

When a logic synthesis of verified logic circuits is executed by a logic synthesis section, respective input variables, main terms, a minimum logical-OR form, and a cover condition of a logical expression are retained as reusable elements. In an optimization of a program code executed by a dedicated compiler, the program code is optimized by using the reusable elements. Thus, the processing time for the optimization of the program code can be shortened, and also, the amount of memory being used can be reduced.

6 Claims, 19 Drawing Sheets

$Y = \overline{A}BC + A\overline{B}C + AB\overline{C} + \overline{A}\overline{B}C + \overline{A}B\overline{C} + A\overline{B}\overline{C} \cdots\cdots (1)$

METHOD AND APPARATUS FOR PREPARING A LOGIC SIMULATION MODEL AND RECORDING MEDIUM FOR STORING THE SAME

BACKGROUND OF THE INVENTION

1. Field of the Invention

The present invention relates to a method for preparing a logic simulation model used in circuit verification of a semiconductor device.

2. Description of Related Art

In a circuit design of a semiconductor device, it is necessary to carry out a logic simulation at a design stage for verifying whether or not the logic of the circuit operates normally. In order to perform the logic simulation on an actual hardware model, a restriction occurs in a modeling. Therefore, a logic simulation is carried out at a high speed by preparing a software model described with object codes representing an operation of the logic circuit precisely in logic and in timing, and by executing the software model.

As a method for preparing this type of software logic simulation model, for example, Japanese Patent Application Pre-examination Publication No. JP-A-08-263530 proposes a logic simulation model preparing method capable of extracting logic information and delay information from a verified logic circuit, and preparing a model which has an optimized logical representation and is equivalent in logic simulation to an original logic circuit and which can be simulated at a high speed.

However, if a circuit scale becomes large, this method becomes to requires a great deal of time and labor in order to verify the whole of the circuit. Therefore, it is common to retain, as a library in units of block, circuit blocks that have been confirmed to be normal after a first verification is executed, and to use the verified circuit blocks without modification at the time of designing a new circuit, thereby to shorten the time for verification. In this case, a logic equivalent to the logic represented by the verified circuit block is logically expressed by means of software, and the whole of the logic circuit is logically simulated.

Now, the above mentioned prior art method for preparing the logic simulation model will be described with reference to FIG. 16.

First, a logic synthesis is carried out on the basis of a logic design data base 102 and verified logic circuits 101 by means of a logic synthesis section 1619.

In the logic synthesis section 1619, first, a function of logic gates included in the verified logic circuits 101 is extracted from the logic design data base 102 (step 103), and then, the logic gates are connected in accordance with connection information to prepare a logic network (step 104). Furthermore, a FFR (fanout free region) division is executed for a combinational circuit included in the logic circuit.

Here, the FFR division means to analyze a connection relation in the combinational circuit and to divide the combinational circuit in a place where a signal line is fanned out Thereafter, a two-step logicizing is performed in which the logical expression is converted into an expression using a two-step logic of an AND and an OR (step 106), and finally, a logic optimization is carried out (step 1607). Thus, a logic network 1601 constituted of optimized combinational circuits and sequential circuits is obtained.

Here, the logic optimization means to convert a given logical expression into a logical expression having a minimum number of operations.

Next, the processing of the two-step logicizing (step 106) and the processing of the logic optimization (step 1607) will be described in detail on a specific example with reference to FIG. 17.

Here, explanation will be made on the case of logically optimizing a logic circuit shown in FIG. 18. The logic circuit of FIG. 18 executes a logical operation for three inputs A, B and C, and obtains one output Y.

The logic function 201 of the FFR divided in the step 105 is first developed into minterms so that a cube list 203 is prepared (step 202) Here, the "cube" means a term in a logical expression.

If the logic circuit shown in FIG. 18 is expressed in a two-step-logicized logical expression, the logical expression can be expressed as the equation (1) shown in FIG. 18. Here, "ABC" indicates a logical AND of "A", "B" and "C". An upper bar given to a character indicates an inversion, and "+" means a logical OR.

This logical expression is prepared as the cube list 203. The Karnaugh map 215 shows this logical expression.

Next, main terms are generated from the logical expression included in the cube list 203, and are stored as a main term table 205 (step 204).

Then, only indispensable terms are selected from the main terms, and selected cover conditions 207 are stored in a cover table 207 (step 206). The Karnaugh map 217 shows the indispensable terms. There are a plurality of methods for selecting the indispensable terms from the main terms. The "cover" indicates which of the main terms is selected as an indispensable term.

By obtaining the logical OR of the indispensable terms, a minimum logical-OR form 208 is obtained as shown in a logical expression 218.

Finally, this minimum logical-OR form 208 is converted into a truth table 219 in the form of a cube expression, and stored as a logic network 1601 (step 209).

Next, by using the logic network 1601, a LCC (levelized compiled code) processing precedence is determined (step 1602).

In a logic circuit having no need of considering a delay, a final result of the logic circuit can be obtained by operating each of gate circuits that constitute that logic circuit, one time.

And, a method for determining the precedence for operating the respective gate circuits is an LCC analysis. In the prior art, this LCC analysis could be applied only to analysis of a logic constituted of only combinational circuits. A method for making it possible to apply the LCC analysis to a sequential circuit by giving a condition to the circuit, is described in Japanese Patent Application No. 165341/1997 (Japanese Patent Application Pre-examination Publication No. JP-A-10-340291).

A delay information generator 116 extracts timing information from the logic circuit information in the verified logic circuits 101. Then, a static delay analysis is carried out (step 120) and an input-to-output delay is calculated (step 121). Thus, a hash table 117 and a delay data base 118 can be obtained.

The hash table 117 is provided for a high speed retrieval of the delay data base 118 by using the name and the value of an input terminal and an output terminal, as a key.

Finally, the program code is optimized by a general purpose compiler, so that a simulation model object code 115 is prepared (step 1603).

In the prior art method for preparing the logic simulation model, at the time of optimizing the program code, the general purpose compiler independently analyzes the program similarly to an analysis of an ordinary program.

For example, in an example of the optimization of the program code, an optimizing compiler analyzes the program for the program-coded simulation mode, and collects information as to where the logical operation and the load/store of the variable values are executed in the program, and then, omits unnecessary codes.

This optimization of the program code in the prior art method for preparing the logic simulation model will be specifically described with reference to FIG. 19.

A program code (before optimization) 511 is one obtained by converting some logical expressions FFR1 and FFR2 into program codes. In this program code, it has been determined by the LCC processing precedence determination in the step 1602 that the logical expression FFR1 is executed prior to the logical expression FFR2.

In this analysis of the general purpose compiler, since both the operation of obtaining "r3" from "r1" and "r2" and the operation of obtaining "r13" from "r11" and "r12" are executed by the operation of "x1·x2", program codes 510 become unnecessary by omitting the operation executed later and by substituting "r3" for "r13", with the result that the number of operations can be reduced.

As mentioned above, the program code 511 is analyzed and optimized by the general purpose compiler so that a program code (after optimization) 512 can be obtained.

In this prior art method for preparing the logic simulation model, the optimizing compiler analyzes the program for the program-coded simulation mode, and collects information as to where the logical operation and the load/store of the variable values are executed in the program, and then, omits unnecessary codes.

As explained above, in this prior art method for preparing the logic simulation model, the step for optimizing the combinational logic by means of the logic synthesis and the step for optimizing the program code by the compiler are independent of each other, and information required for optimization is acquired in each step independently of the other step.

Therefore, a large amount of memory and a long processing time are required for optimizing the program of the simulation model.

The problem with above mentioned prior art method for preparing the logic simulation model is if the circuit scale becomes large, a large amount of memory and a long processing time are required for optimizing the program code of the logic simulation model.

SUMMARY OF THE INVENTION

Accordingly, it is an object of the present invention to provide a method for preparing a logic simulation model, which can process the optimization of a program code at a high speed and which does not require a large amount of memory for that processing.

In order to achieve the above mentioned object, a method in accordance with the present invention for preparing a logic simulation model, comprises extracting a logic block from a verified logic circuit information and executing a logic synthesis of optimizing the logic of the logic block;
converting the optimized logic block into a program code and optimizing the program code; and
converting the optimized program code into a simulation model object,
wherein elements of a logical expression indicating a logical representation of the logic block, generated in the processing for executing the logic synthesis, are retained as reusable elements, and the reusable elements are used in the processing for optimizing the program code.

The present invention is so configured that information concerning the logic of the logic circuit, obtained from executing the logic synthesis, are retained as reusable elements, and the reusable elements are used at the time of optimizing the program code.

Therefore, it is possible to shorten the processing time for the optimization of the program code, and also to reduce the amount of memory being used.

In addition, in an embodiment of the present invention, the reusable elements include respective input variables, main terms, a minimum logical-OR form, and a cover condition of the logical expression.

DESCRIPTION OF THE PREFERRED EMBODIMENTS

Now, an embodiment of the present invention will be described in detail with reference to the drawings.

Figure 1:
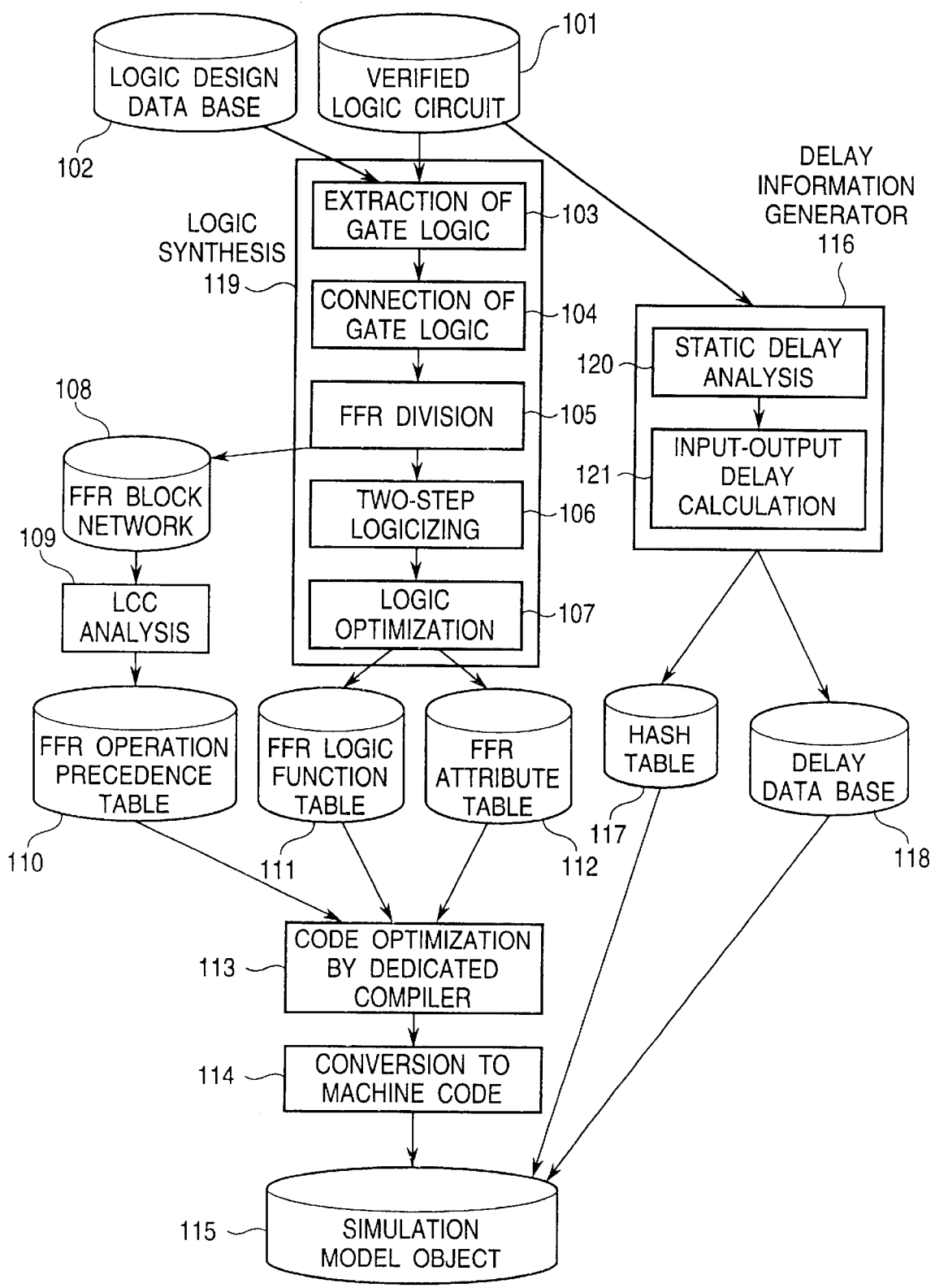
FIG. 1 is a flow chart for illustrating one embodiment of the method in accordance with the present invention for preparing a logic simulation model.
Figure 16:
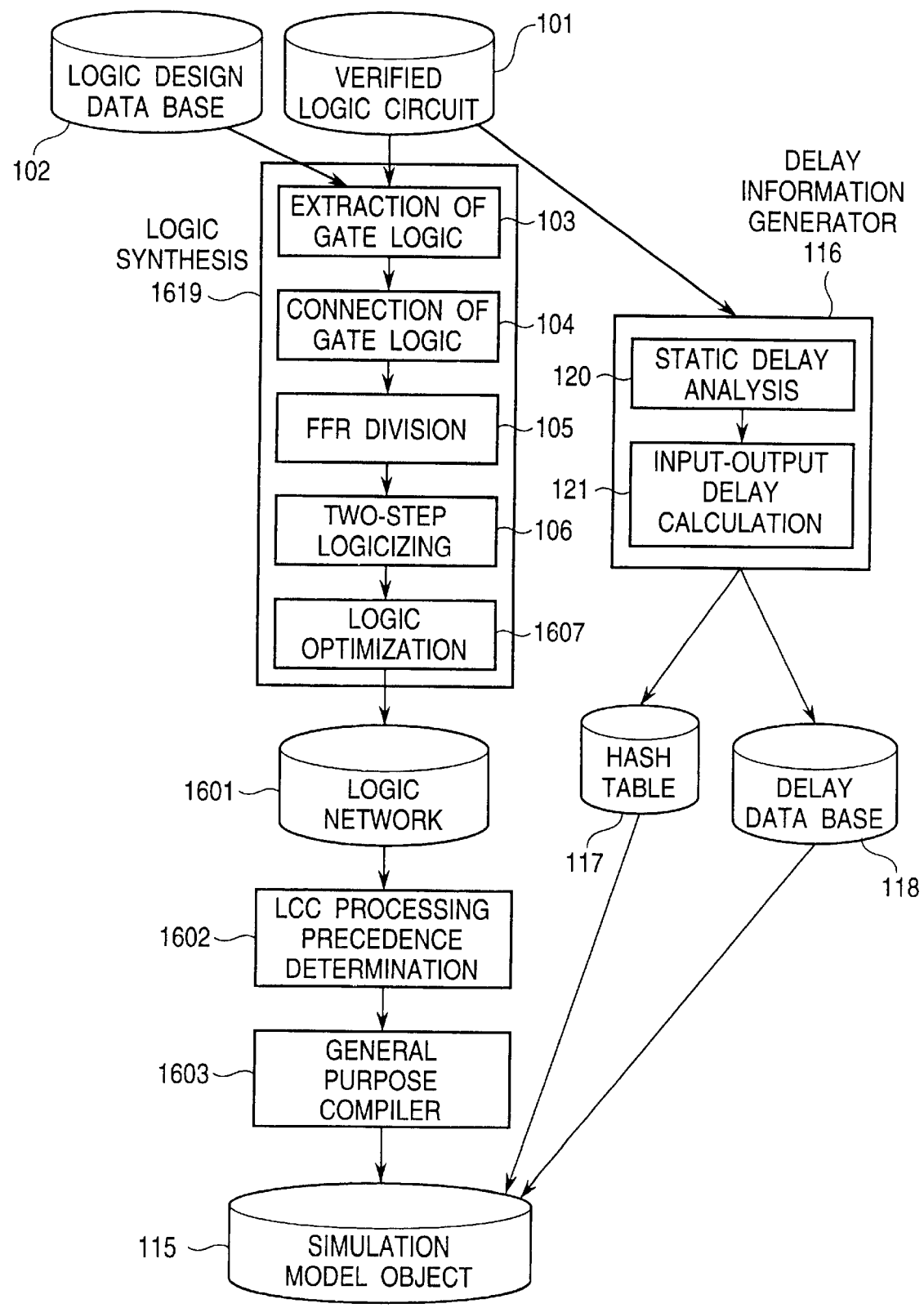
FIG. 16 is a flow chart for illustrating the prior art method for preparing the logic simulation model.
Figure 17:
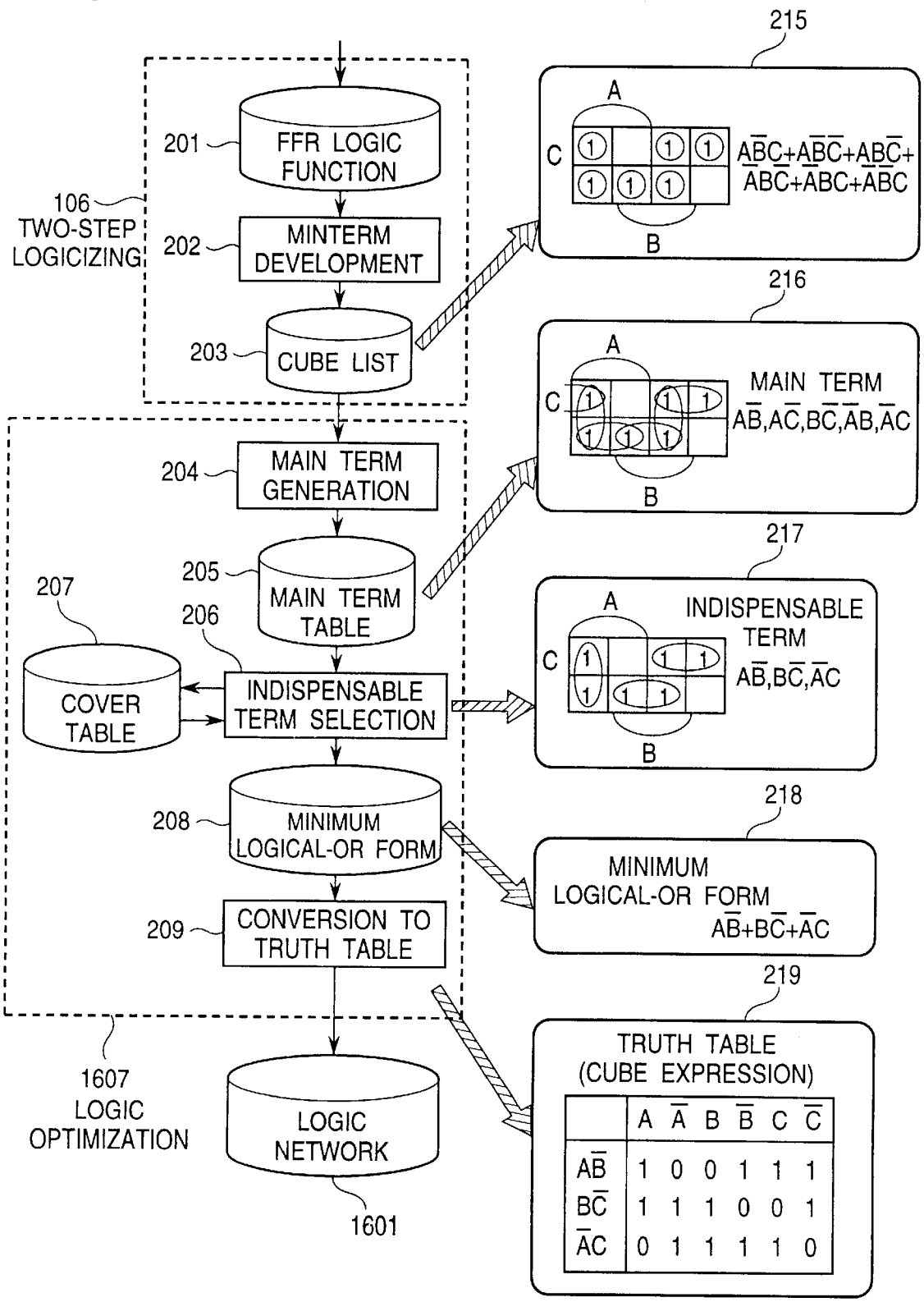
FIG. 17 is a flow chart for illustrating the two-step logicizing (step 106) and the logic optimization (step 107) in the logic synthesis section 1619 shown in FIG. 16.
Figure 18:
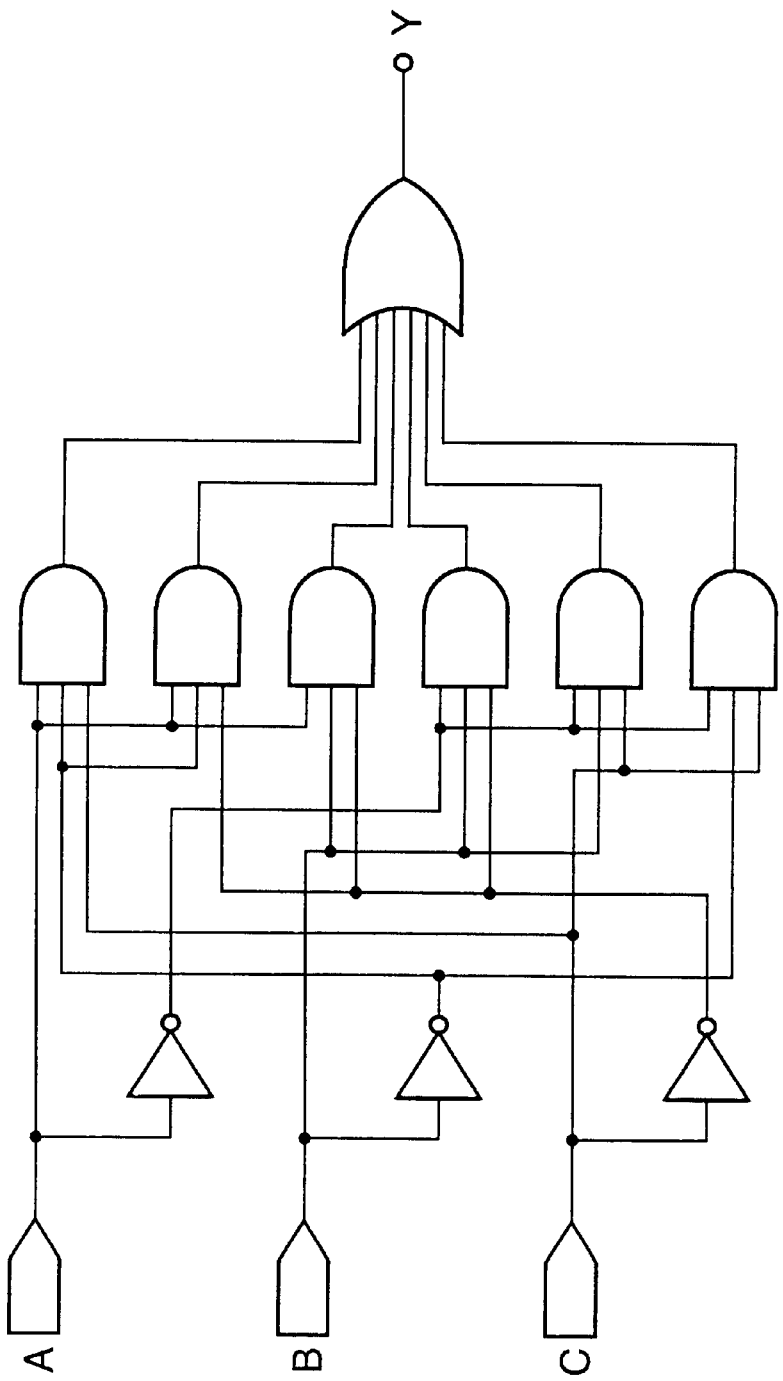
FIG. 18 is a circuit diagram of a specific logic circuit used for illustrating the processing of the logic synthesis.

FIG. 1 is a flow chart for illustrating one embodiment of the method in accordance with the present invention for preparing the logic simulation model. The same reference numbers as those given in FIGS. 16 and 17 indicate the same constituents as those shown in FIGS. 16 and 17.

In the embodiment of the method in accordance with the present invention for preparing the logic simulation model, a logic synthesis is carried out on the basis of verified logic circuits 101 and a logic design data base 102 by using a logic synthesis section 119 in place of the logic synthesis section 1619.

The logic synthesis section 119 extracts an FFR block network 108 in the FFR dividing processing (step 105), in addition to the logic synthesis section 1619 in the prior art method for preparing the logic simulation model, and executes a logic optimization (step 107) in place of the logic optimization (step 1607). Here, the FFR block network 108 is that which is prepared on the basis of connection information of the logic circuit by considering an FFR block as one node, and therefore includes only the connection information of the FFR block but does not include logic information within the FFR block.

Figure 2:
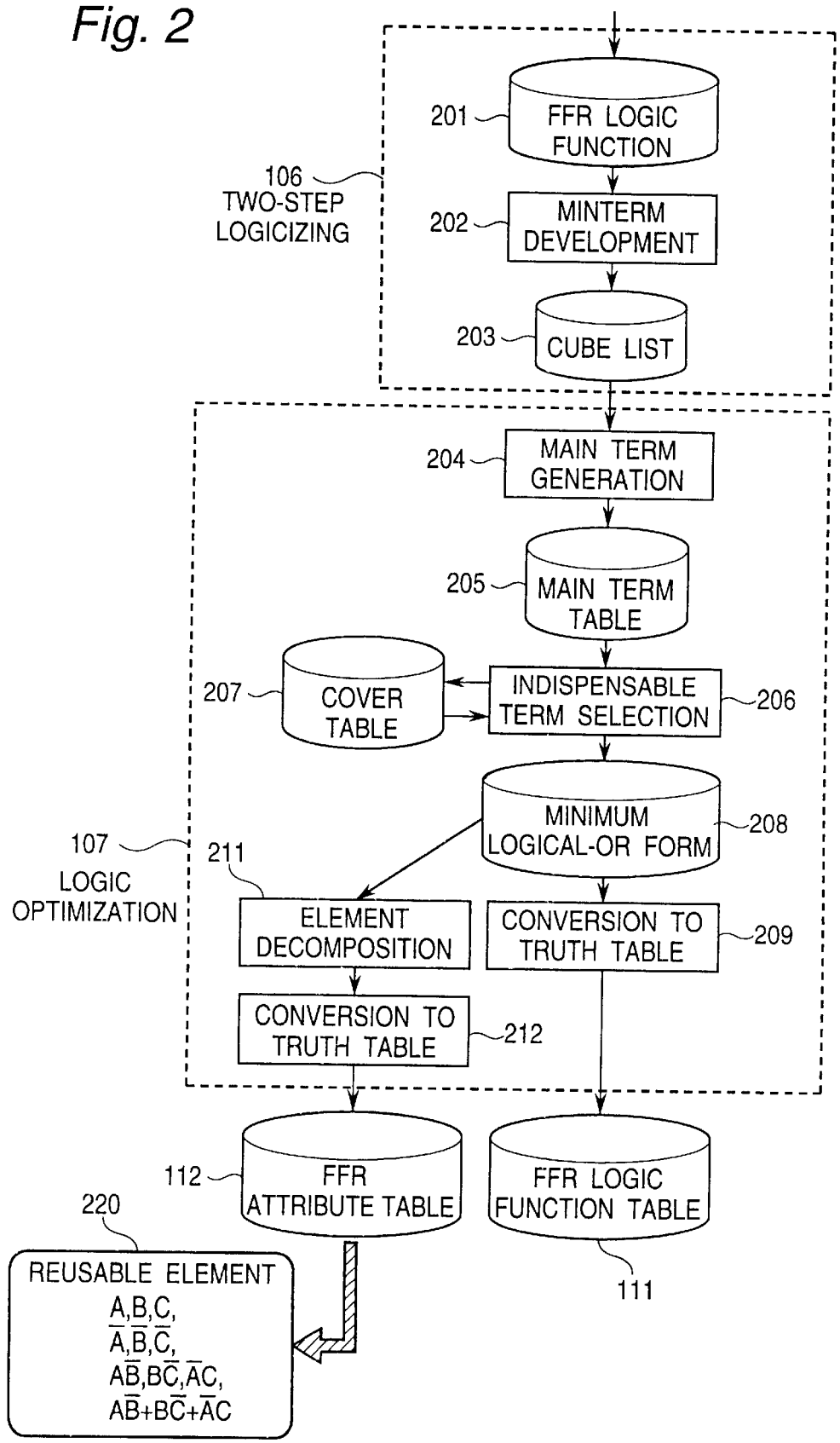
FIG. 2 is a flow chart for illustrating a two-step logicizing (step 106) and a logic optimization (step 107) in a logic synthesis section 119 shown in FIG. 1.

Now, the logic optimization in the step 107 will be described with reference to FIG. 2.

In this method, the processing until it is converted into the minimum logical-OR form 208 is the same as that in the prior art method for preparing the logic simulation model. In the logic optimization of the step 107, element decomposition is carried out from the minimum logical-OR form 208 (step 211), and obtained elements are converted into a truth table (step 212) and stored in an FFR attribute table 212 as reusable elements 220.

On the other hand, after the minimum logical-OR form 208 is converted into the truth table, it is stored in an FFR logic function table 111 (step 209).

Figure 3:
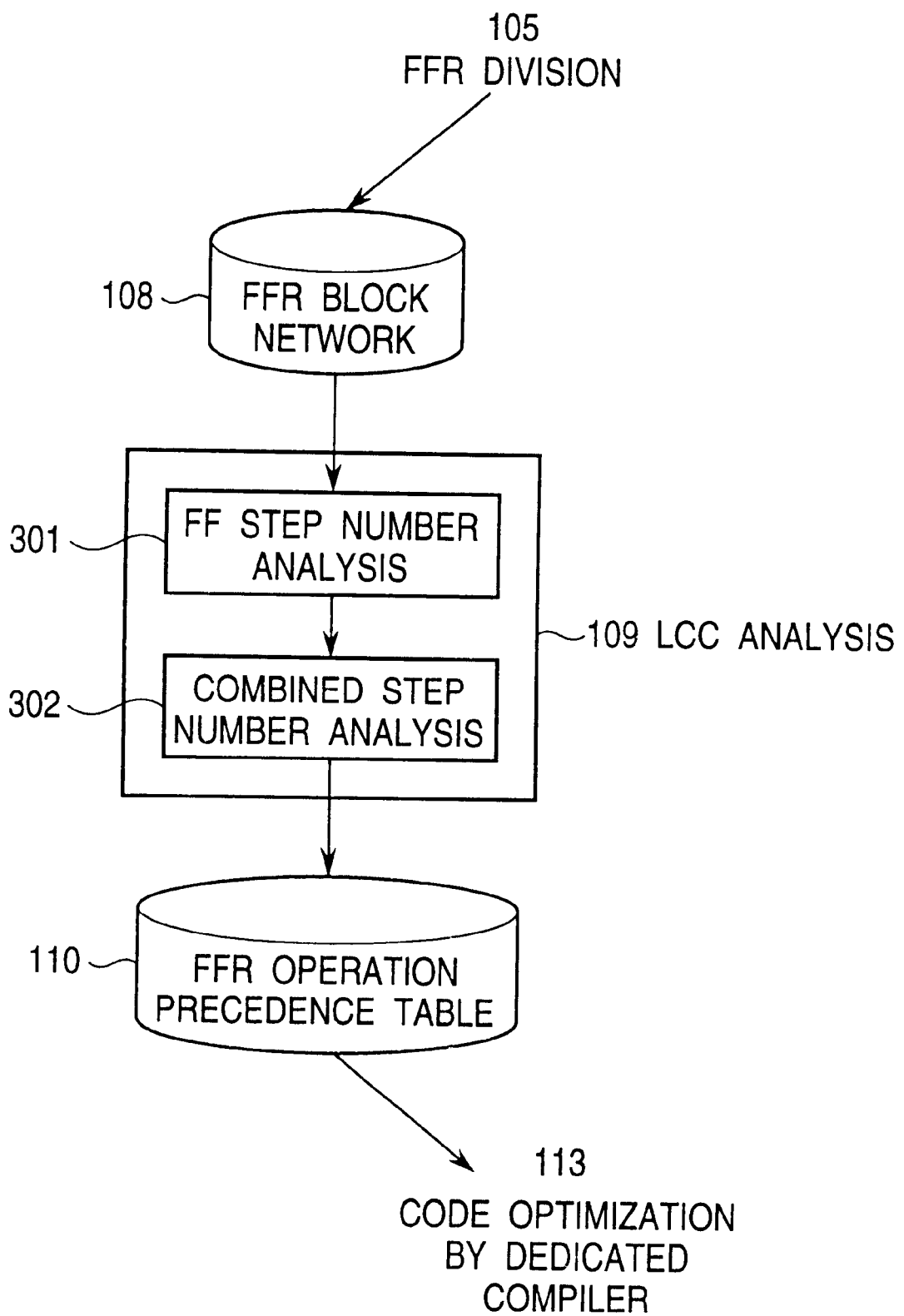
FIG. 3 is a flow chart for illustrating an LCC analysis (step 109)

In addition, an LCC analysis is carried out for the FFR block network 108 in FIG. 1 (step 109). This LCC analysis analyzes the priority order of the operation of gates from the connection structure of the logic circuit, and determines the operation precedence in which respective gates execute their operation one time in the order from a high priority. In this LCC analysis, as shown in FIG. 3, first, the number of FFR steps is analyzed (step 301), and then, the number of combined steps are analyzed (step 302). The operation precedence obtained by the LCC analysis is stored in an FFR operation precedence table 110.

Figure 4:
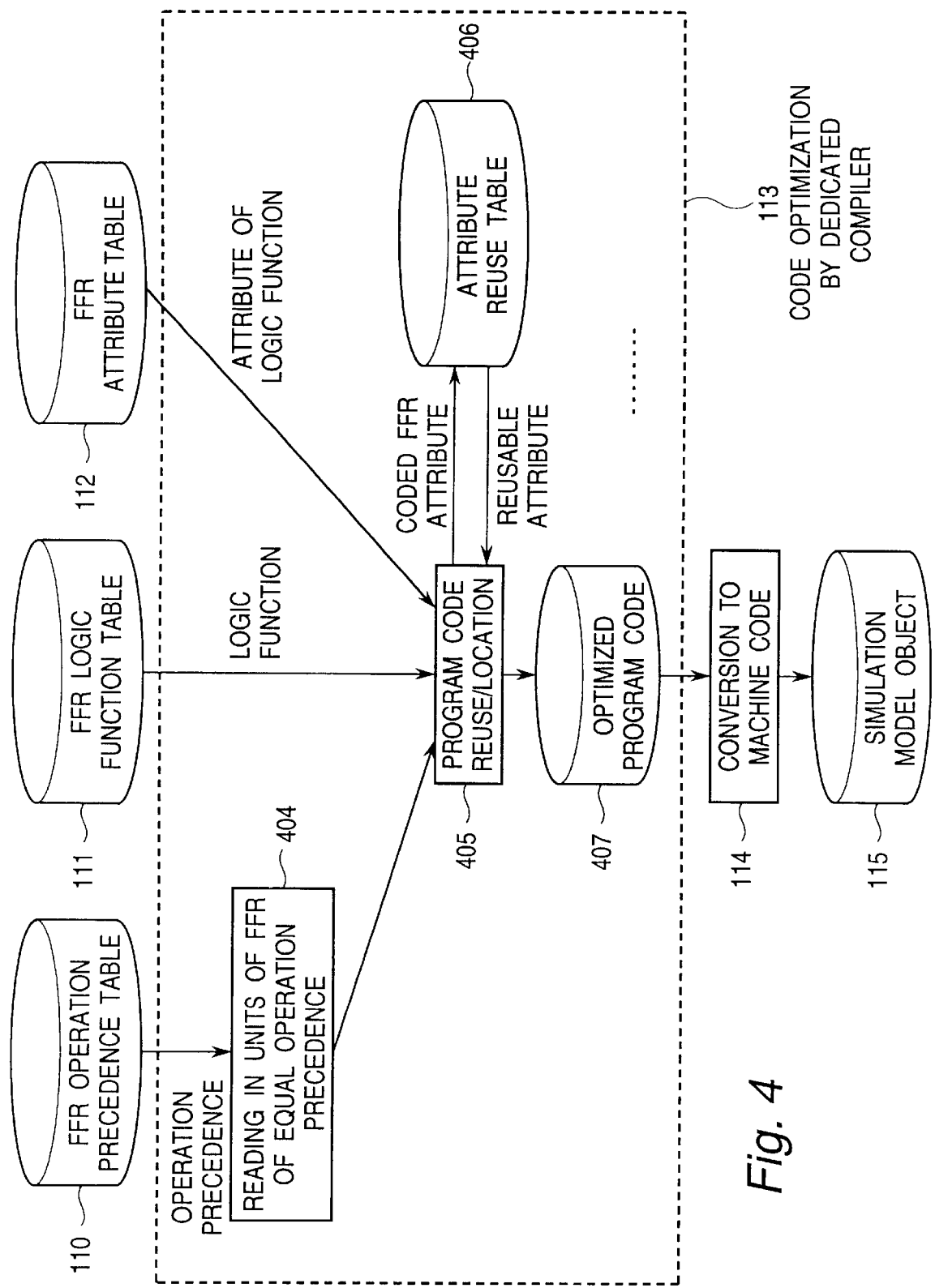
FIG. 4 is a flow chart for illustrating an optimization of a program code by a dedicated compiler (step 113)

Next, the optimization is carried out by use of a dedicated compiler on the basis of the FFR operation precedence table 110, the FFR logic function table 111 and the FFR attribute table 212 (step 113). Now, the processing in this step 113 will be described in detail with reference to FIG. 4.

First, the operation precedence of each FFR is investigated by using the FFR operation precedence table 110, and the FFR having the highest operation precedence is selected. At this time, if there are FFRs having an equal operation precedence, those FFRs are simultaneously selected (step 404). Furthermore, the logic functions of the selected FFRs are read out from the FFR logic function table 111, and the attribute of the read-out logic function is read out from the FFR attribute table 212.

Then, the omission of equivalent operations attained by reusing the program code, and the relocation of the program code for reducing the memory access, are carried out by using an attribute reuse table 406, so that an optimized program code 407 is obtained.

In the reuse and relocation of program codes in the step 405, by utilizing the reusable elements 220 obtained in the logic optimization, it becomes possible to know what logical operation is executed in which FFR block by accessing to which variable, without newly analyzing the program code. Therefore, it is possible to optimize the program code more efficiently in a processing time and in the amount of memory being used, than the prior art processing carried out by using the general purpose compiler.

Finally, the processing for converting the optimized program code 407 into a machine code so as to obtain a simulation model object 115 (step 114), and the processing for preparing the hash table 117 and the delay data base 118 from the verified logic circuits 101 by means of the delay information generator 116 and for preparing a data base of delay information between external terminals, obtained by a static delay analysis, and adding it into the simulation mode, are the same as those in the prior art method for preparing the logic simulation mode.

Figure 5:
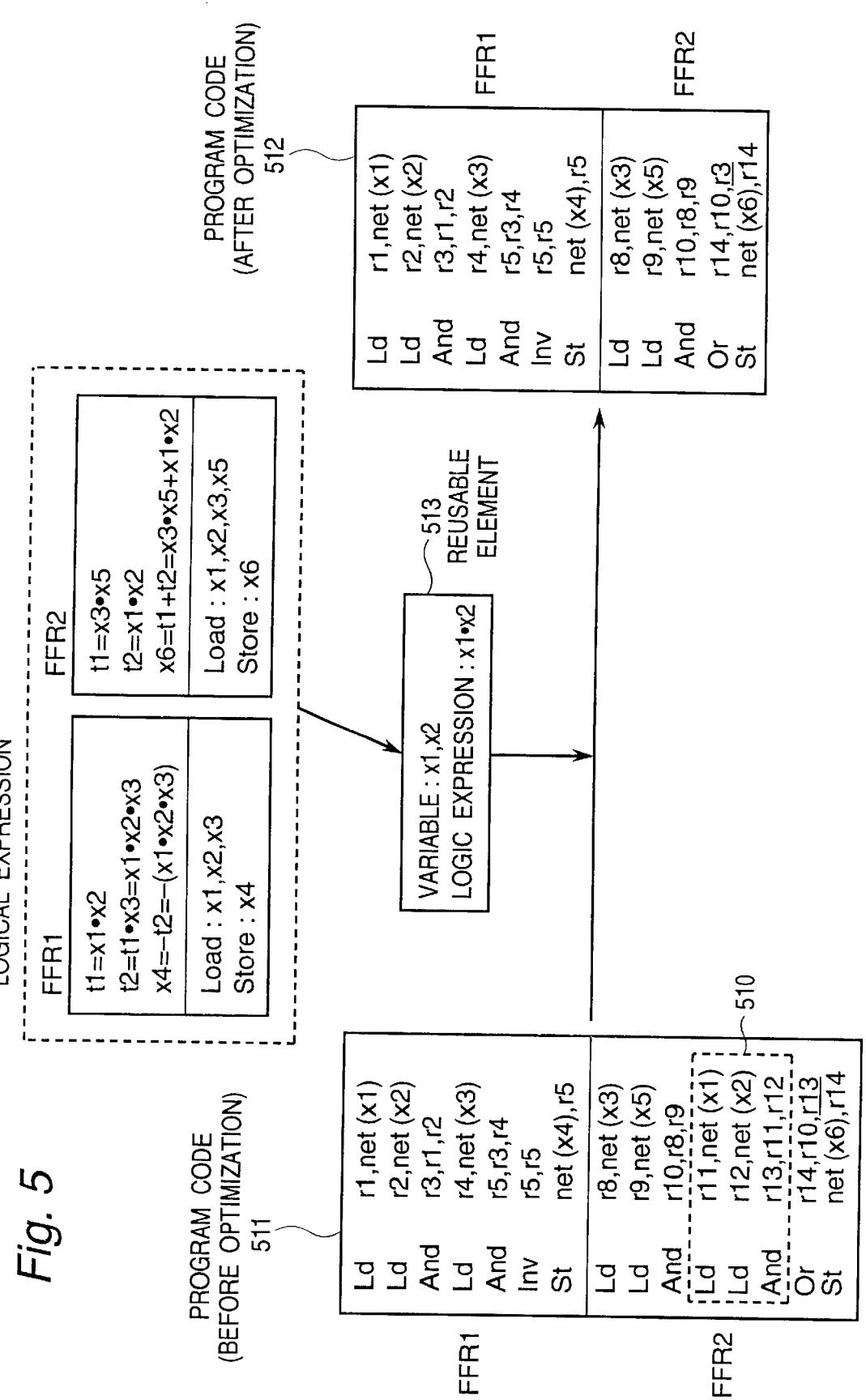
FIG. 5 is a view illustrating the optimization of the program code by the dedicated compiler (step 113) with reference to a specific example.

Next, the method for optimizing the program code in the step 405 will be specifically described with reference to FIG. 5.

Figure 19:
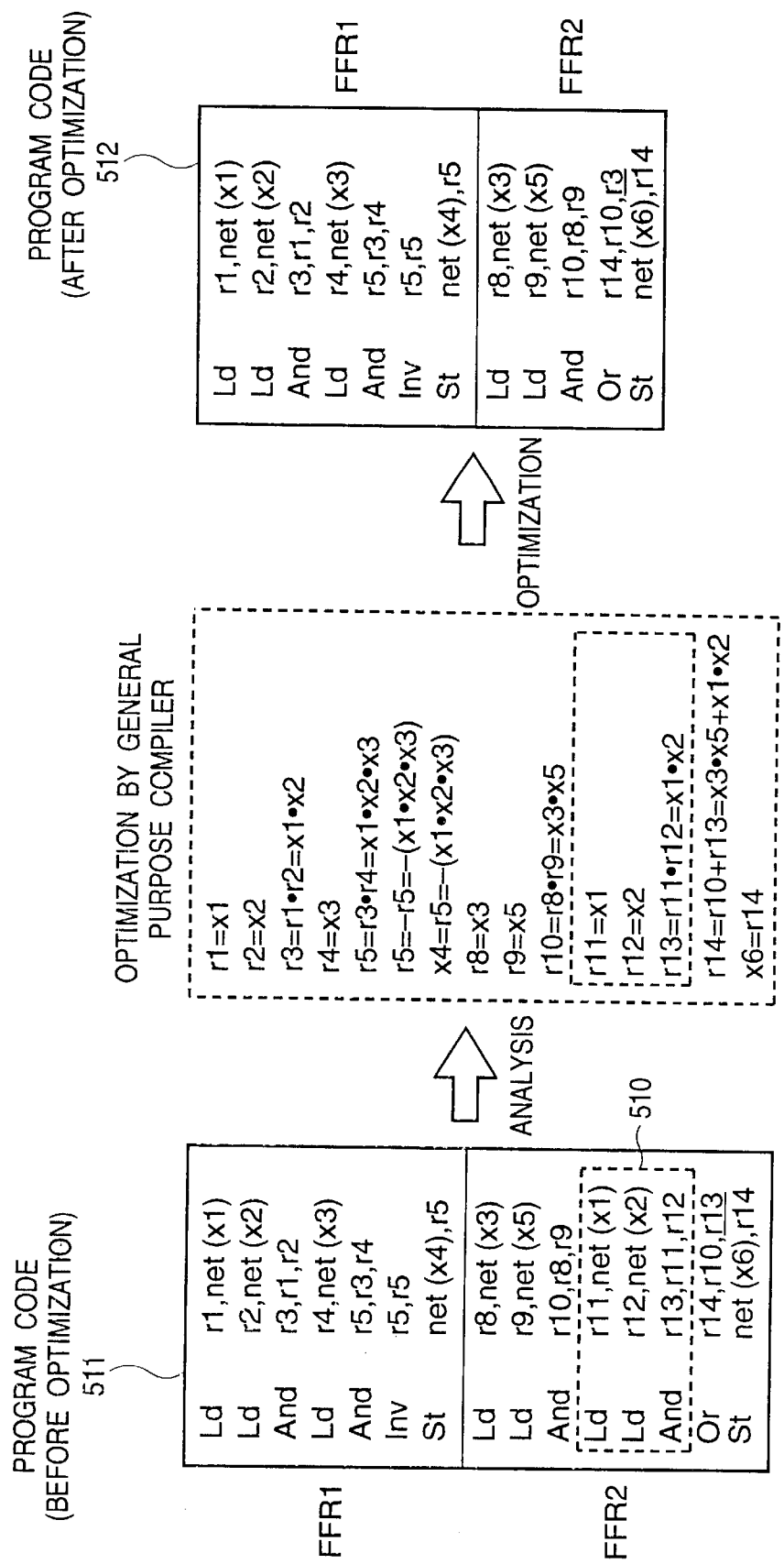
FIG. 19 is a view illustrating the optimization of the program code by the general purpose compiler (step 1603) with reference to a specific example.

In this description, a program code (before optimization) 511 is the same as the program code shown in FIG. 19 which was used in the description of the prior art method for preparing the logic simulation model.

Reusable elements 513 obtained in the logic synthesis of the logical expressions FFR1 and FFR2 are retained. Here, the variables "x1" and "x2" and the logical expression "x1·x2" are retained as the reusable elements 513.

Then, the optimization of the program code is carried out by using the reusable elements 513. Since the FFR1 and FFR2 are located in the order of the operation precedence in the simulation by means of the LCC processing, a certain operation "x1·x2" in FFR2 is already executed in FFR1, and therefore, this operation can be omitted in FFR2 by using the result of the operation in FFR1 as shown. In addition, as regards the values of the variables "x1" and "x2", if the values loaded in registers in FFR1 are used, excessive memory accesses can be omitted.

Thus, by supplying the optimizing compiler with information of omissible variables and logical expressions, the optimizing compiler can omit unnecessary codes without newly analyzing the program code.

Next, a specific construction of variable tables will be described with reference to FIGS. 6 to 11.

Figure 6:
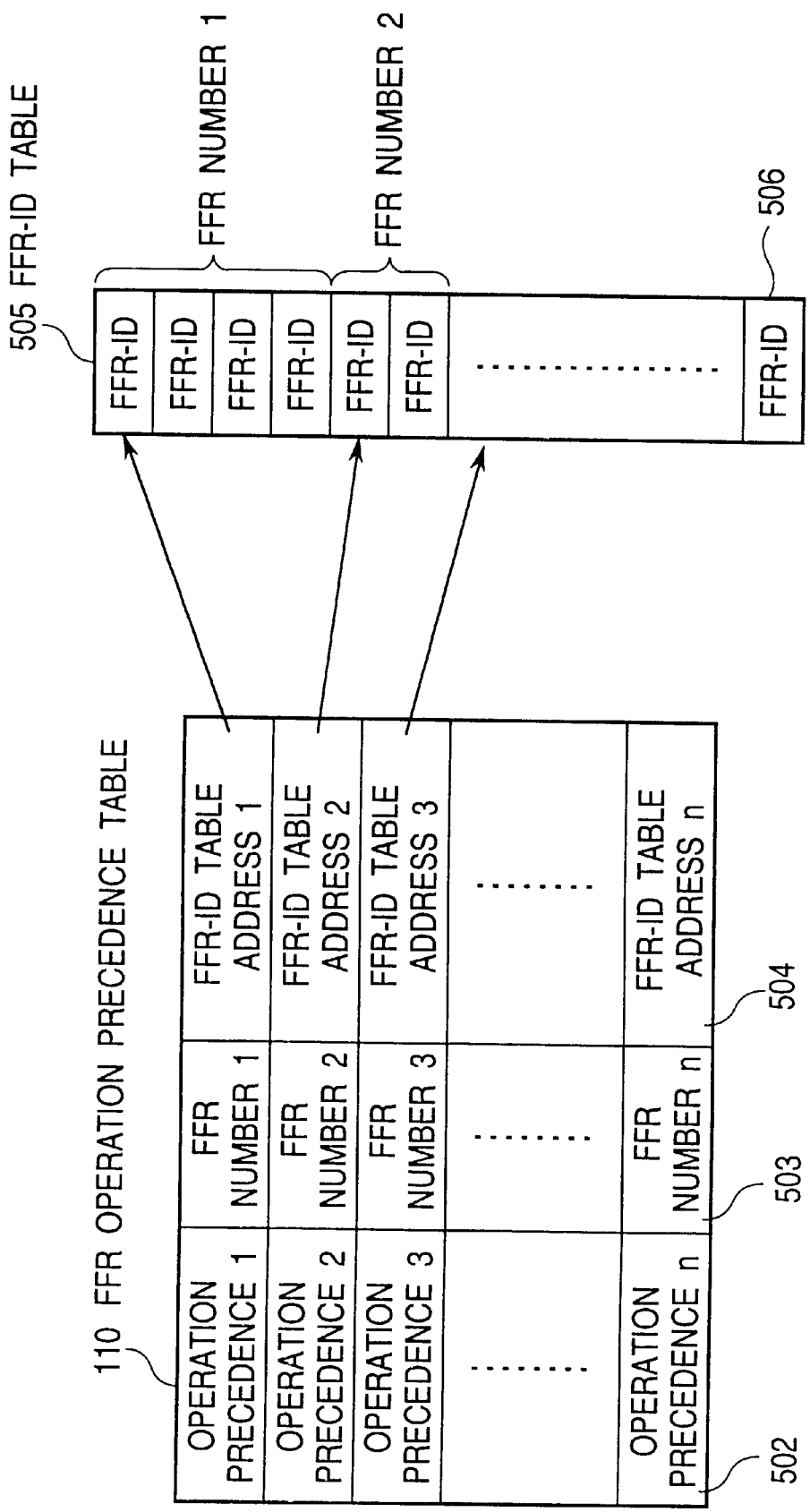
FIG. 6 is a view showing the construction of an FFR operation precedence table 110.

FIG. 6 is a view showing the construction of the FFR operation precedence table 110.

The FFR operation precedence table 110 comprises operation precedences 502, FFR numbers 503 and addresses 504 of FFR-ID tables.

The addresses 504 of FFR-ID tables indicates FFR-IDs 506 which are stored in an FFR-ID table 505 and which are of the same number as the FFR number 503.

Figure 7:
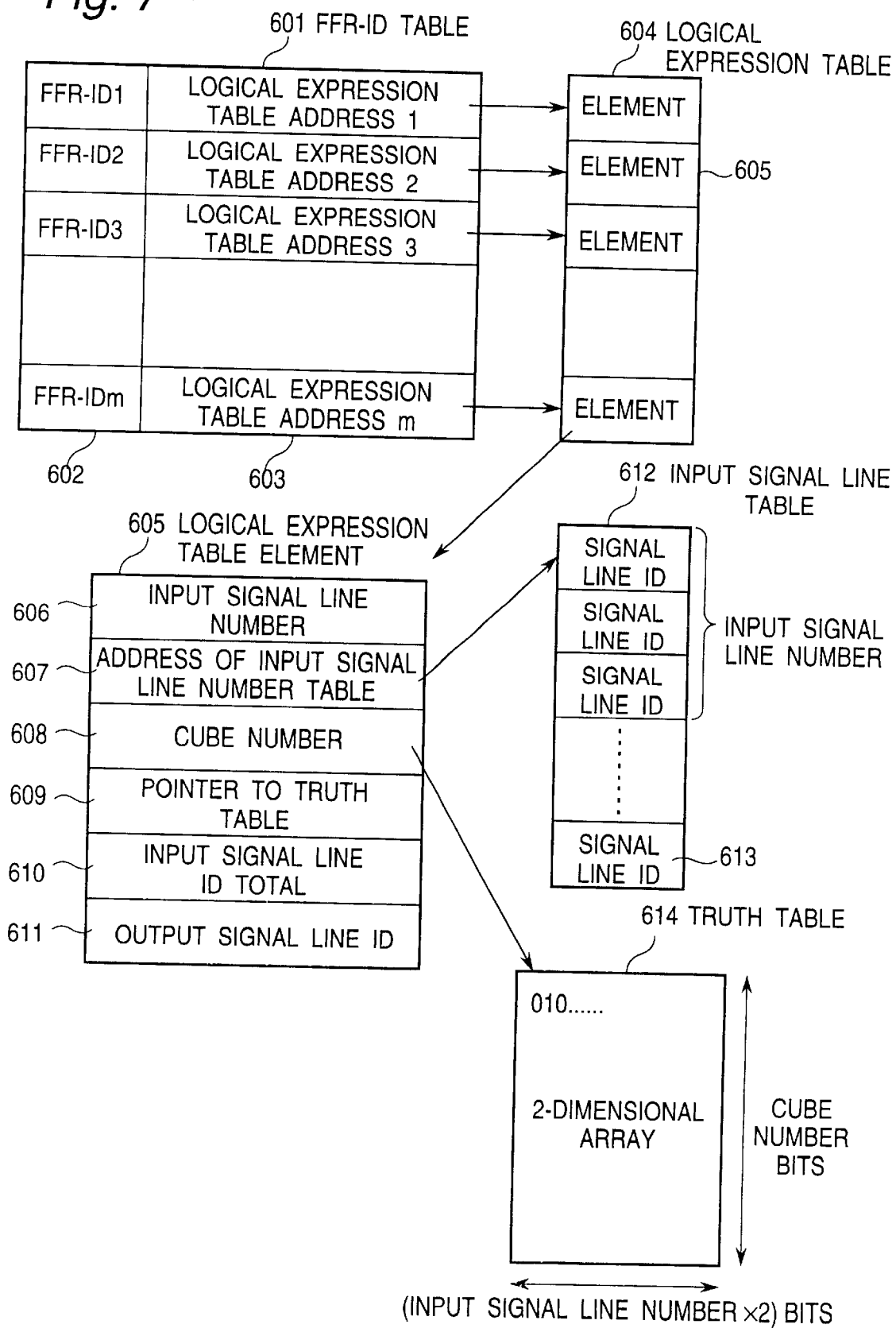
FIG. 7 is a view showing the construction of an FFR logic function table 111.

FIG. 7 is a view showing the construction of the FFR logic function table 111.

The FFR logic function table 111 is a table for storing the logical expression for each FFR, and is so configured that the content of the FFR can be retrieved by using the FFR-ID which is given for each FIR.

The FFR logic function table 111 comprises an FFR-ID table 601, a logical expression table 604, an input signal line table 612 and a truth table 614.

The FFR-ID table 601 includes FFR-IDs 602 and logical expression table addresses 603 indicative of elements 605 of the logical expression table 604.

Each of the elements 605 of the logical expression table includes an input signal line number 606, an address 607 of the input signal line table, a cube number 608, a pointer 609 to the truth table, an input signal line ID total 610 and an output signal line ID 611.

The address 607 of the input signal line table indicates the signal line IDs 613 which are included in the input signal line table 612 and which are of the same number as the input signal line number 606. The pointer 609 to the truth table indicates a truth table 614. This truth table 614 is constituted of a two-dimensional array of the cube number bits by the {input signal line number×2} bits.

Figure 8:
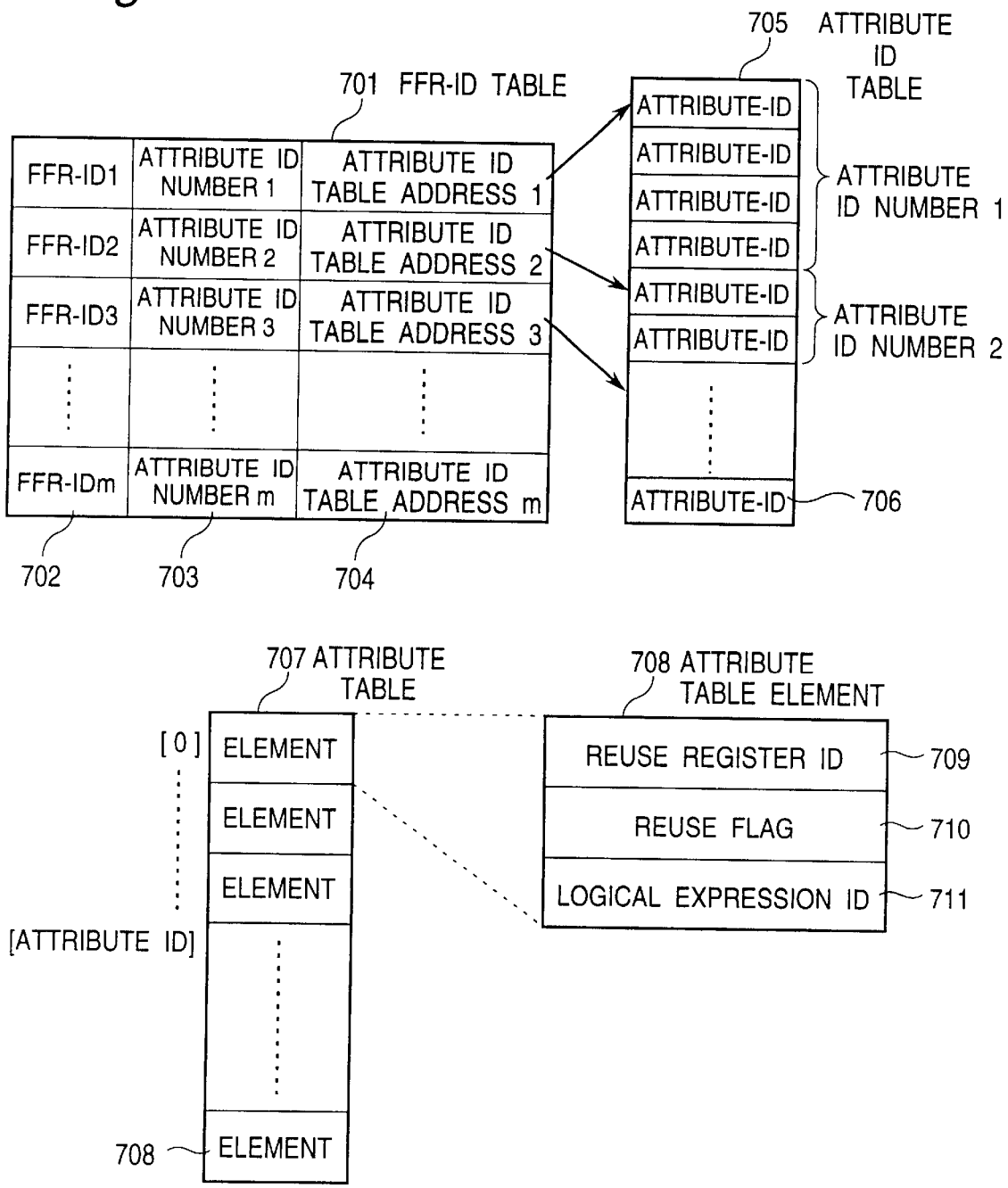
FIG. 8 is a view showing the construction of an FFR attribute table 112.
Figure 9:
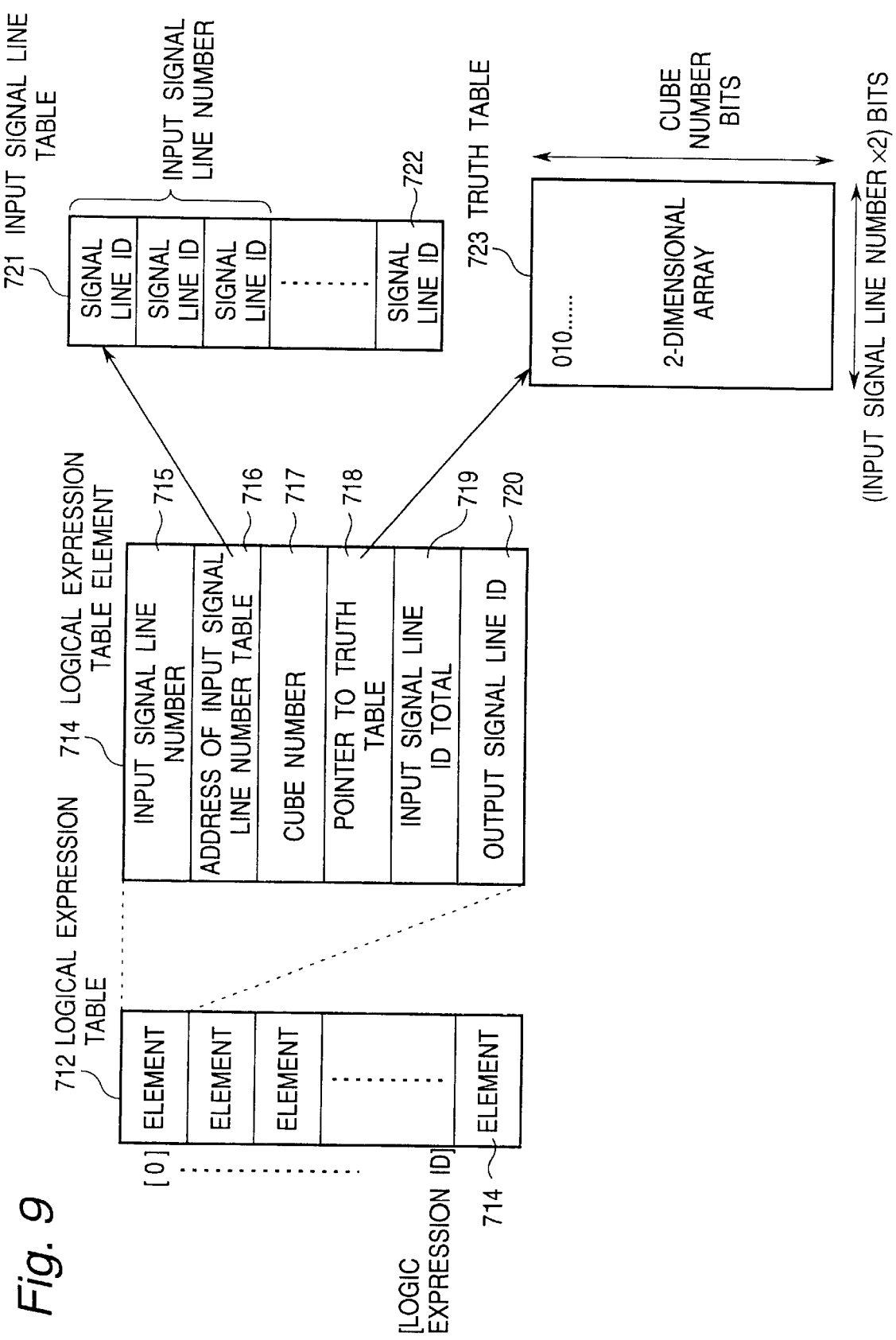
FIG. 9 is a view showing the construction of the FFR attribute table 112.

FIGS. 8 and 9 are views showing the construction of the FFR attribute table 112.

The FFR attribute table 112 includes an FFR-ID table 701, an attribute ID table 705, an attribute table 707 and a logical expression table 712.

The FFR-ID table 701 includes FFR-IDs 702, attribute ID numbers 703 and addresses 704 of the attribute ID table indicating the attribute IDs 706 which are stored in the attribute ID table 705 and which are of the same number as the attribute ID number 703.

The attribute table 707 includes elements 708 corresponding to the attribute IDs 706, respectively. Each of the elements 708 of the attribute table includes a reuse register ID 709, a reuse flag 710 and a logical expression ID 711.

The logical expression table 712 includes elements 714 corresponding to the logical expression IDs, respectively. Each of the elements 714 of the logical expression table includes an input signal line number 715, an address 716 of an input signal line table, a cube number 717, a pointer 718 to a truth table, an input signal line ID total 719 and an output signal line ID 720.

The address 716 of the input signal line table indicates the signal line IDs 722 which are included in the input signal line table 712 and which are of the same number as the input signal line number 715. The pointer 718 to the truth table indicates a truth table 723. This truth table 723 is constituted of a two-dimensional array of the cube number bits by the {input signal line number×2} bits.

Figure 10:
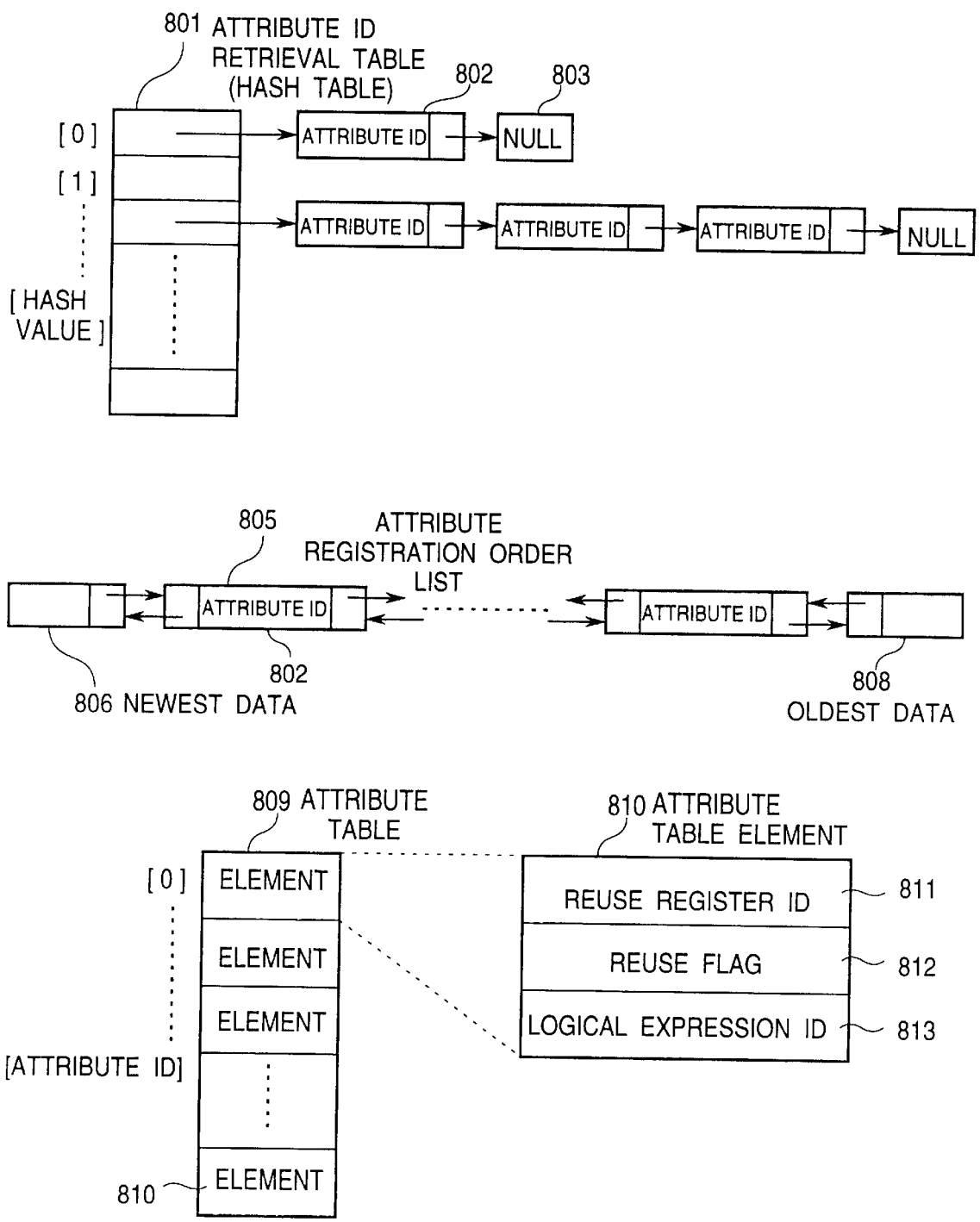
FIG. 10 is a view showing the construction of an attribute reuse table 406.
Figure 11:
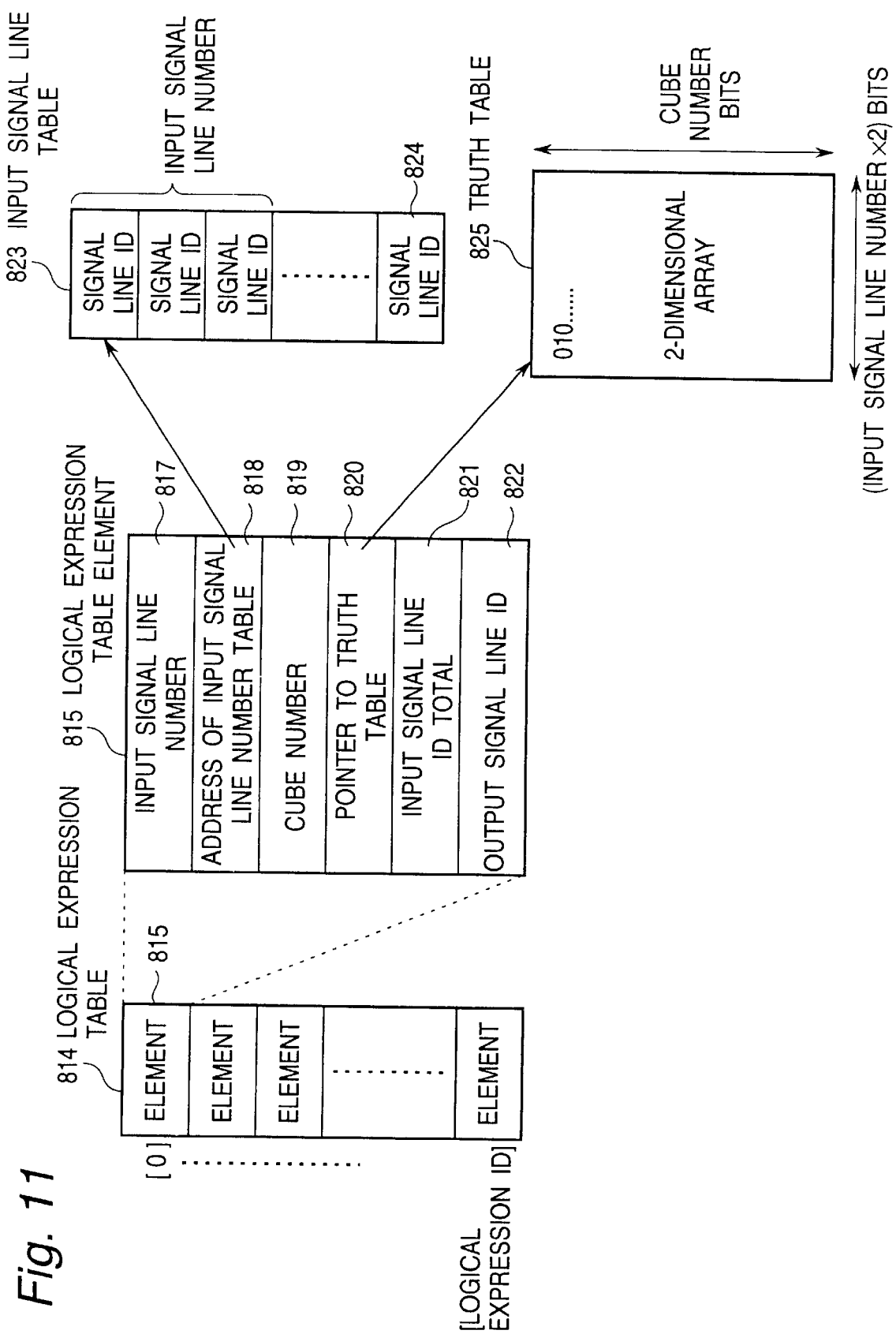
FIG. 11 is a view showing the construction of the attribute reuse table 406.

FIGS. 10 and 11 are views showing the construction of the attribute reuse table 406.

The attribute reuse table 406 comprises an attribute ID retrieval table 801, an attribute registration order list 805, an attribute table 809 and a logical expression table 814. The attribute ID retrieval table 801 is provided for speedily retrieving the attribute ID to be found out, and has a structure of a hash table in which the attribute IDs 802 having the same hash value are registered together in units of the same hash value. Therefore, a plurality of attribute IDs 802 are registered for one hash value, and "NULL" 803 is data indicating that another attribute ID 802 is no longer registered.

Here, the hash value is a value determined by a hash function expressed by the following equation (2):

$$\text{hash value} = h(\text{cube number, input signal line number, input signal line ID total}) \qquad (2)$$

The attribute registration order list 805 is a list of attribute IDs arranged in the order from the oldest one, for the purpose of abandoning the attribute IDs 802 which have become old some degree or more.

The attribute table 809 includes elements 810 corresponding to the attribute IDs 802, respectively. Each of the elements 810 of the attribute table includes a reuse register ID 811, a reuse flag 812 and a logical expression ID 813.

The logical expression table 814 includes elements 815 corresponding to the logical expression IDs 813, respectively. Each of the elements 815 of the logical expression table includes an input signal line number 817, an address 818 of an input signal line table, a cube number 819, a pointer 820 to a truth table, an input signal line ID total 821 and an output signal line ID 822.

The address 818 of the input signal line table indicates the signal line IDs 824 which are included in the input signal line table 823 and which are of the same number as the input signal line number 817. The pointer 820 to the truth table indicates a truth table 825. This truth table 825 is constituted of a two-dimensional array of the cube number bits by the {input signal line number×2} bits.

Figure 12:
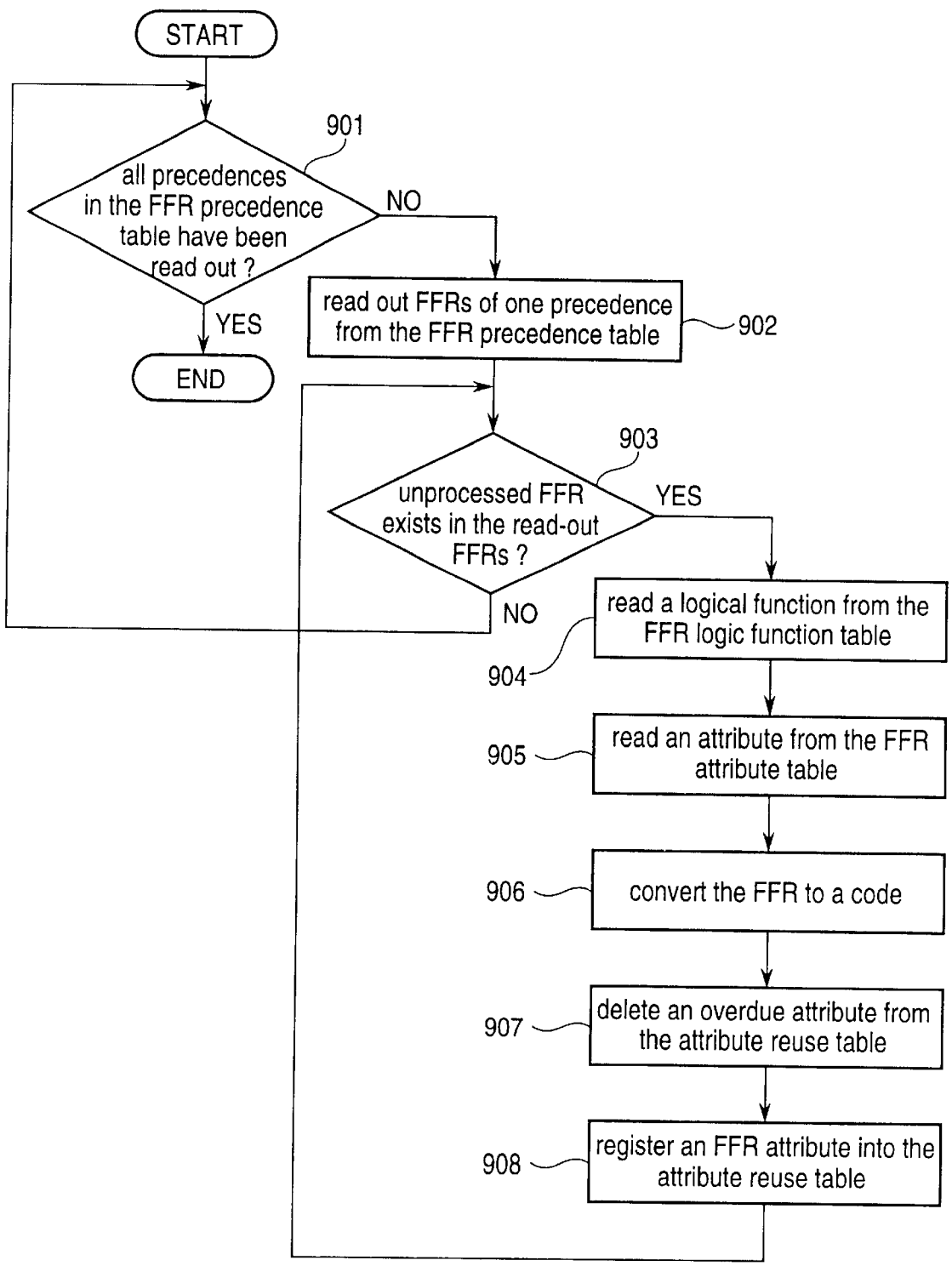
FIG. 12 is a flow chart for illustrating an FFR reading (step 404) and a program code reuse and relocation processing (step 405) in the code optimization process (step 113) by the dedicated compiler.

Now, the FFR reading (step 404) and the program code reuse and relocation (step 405) in the code optimizing processing (step 113) by the dedicated compiler, will be described with reference to the flow chart of FIG. 12.

First, whether or not there remains an operation precedence to be read out in individual precedences of the FFR operation precedence table 110, is discriminated (step 901). If all precedences have been read out, the whole processing is terminated. If there remains an operation precedence to be read out in the step 901, FFRs having one precedence are read out from the FFR operation precedence table 110 (step 902).

Then, whether or not there exists an unprocessed FFR in the read-out FFRs, is discriminated. If there is no unprocessed FFR, the processing returns to the step 901. If there is an unprocessed FFR in the step 903, a logic function is read out from the FFR logic function table 111 (step 904), and then, the attribute of the read-out logic function is read out from the FFR attribute table 112. Further, the FFR concerned is converted into a program code (step 906), and an overdue attribute is deleted from the attribute reuse table 406 (step 907). Finally, the attribute of the FFR concerned is registered in the attribute reuse table 406, and the processing returns to the step 903 (step 908).

Figure 13:
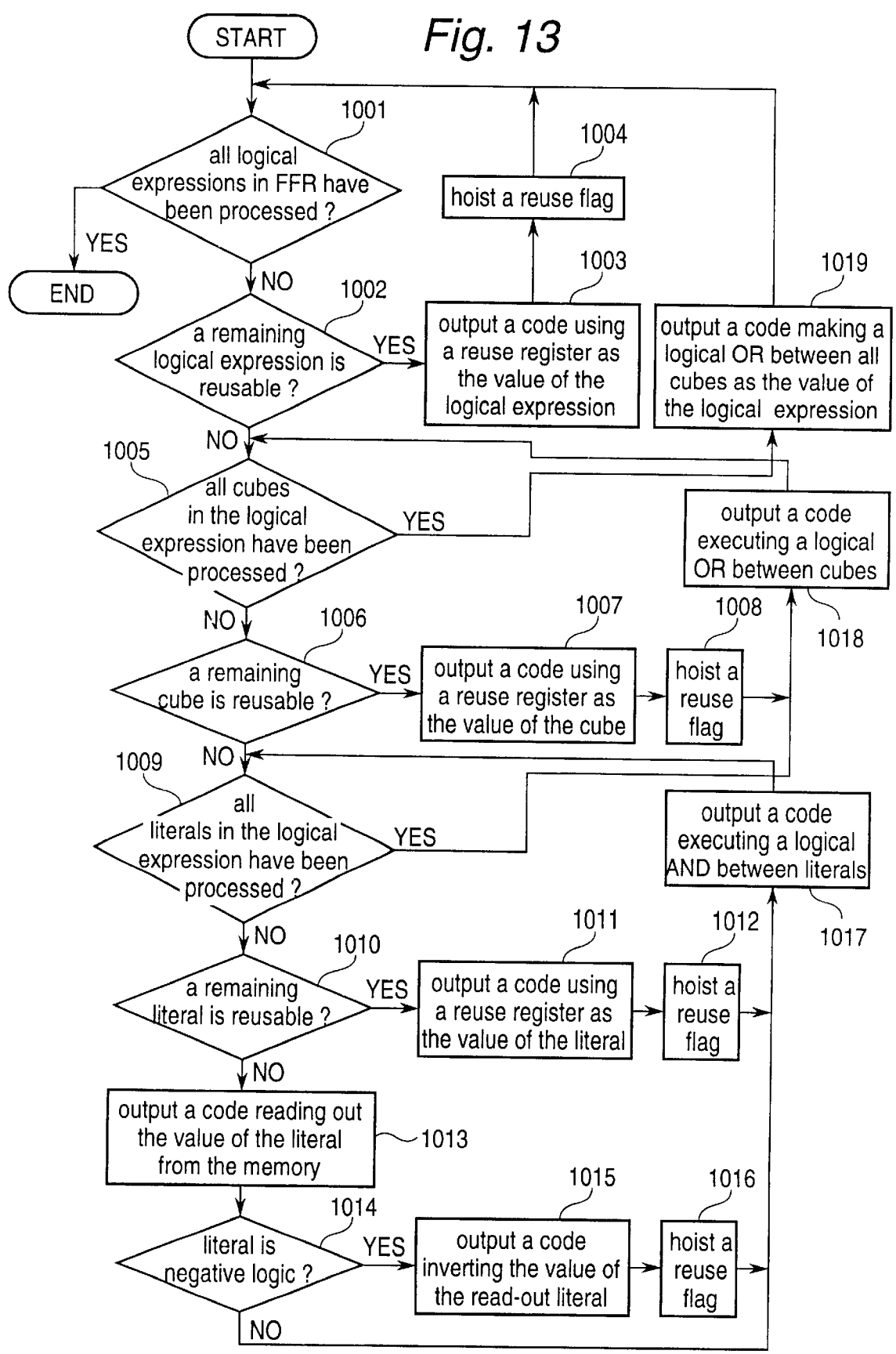
FIG. 13 is a flow chart for illustrating a processing for converting the FFR into codes (step 906), in the flow chart of FIG. 12.

Next, the processing (step 906) for converting the FFR into the code, in the flow chart of FIG. 12, will be described with reference to the flow chart of FIG. 13.

First, whether or not all logical expressions in the FFR have been processed, is discriminated (step 1001). If all the logical expressions have been processed, the whole processing is terminated. If an unprocessed logical expression remains in the step 1001, whether or not the logical expression is reusable, it is discriminated (step 1002). If it is discriminated that it is reusable, a code using the reuse register is outputted as the value of the logical expression (step 1003) and the reuse flag is hoisted and the processing returns to the step 1001 (step 1004).

If it is discriminated in the step 1002 that the logical expression is not reusable, whether or not all cubes in the logical expression have been processed, it is discriminated (step 1005). If it is discriminated in the step 1005 that all cubes have been processed, a code making a logical OR between all the cubes as the value of the logical expression is outputted, and the processing returns to the step 1001 (step 1019).

If it is discriminated in the step 1005 that an unprocessed cube remains, whether or not the cube is reusable is discriminated. If it is discriminated in the step 1006 that the cube is reusable, a code using the reuse register as the value of the cube is outputted (step 1007). Furthermore, the reuse flag is hoisted (step 1008), and a code for executing an logical OR between the cubes is outputted and the processing returns to the step 1005 (step 1018).

If it is discriminated in the step 1006 that the cube is not reusable, it is discriminated whether or not all literals in the logical expression have been processed (step 1009). Here, the literal indicates an input variable, exemplified by "A", "B", etc. in the logical expression shown in FIG. 17. If it is discriminated in the step 1009 that all literals have been processed, the processing goes to the step 1018. If it is discriminated in the step 1009 that an unprocessed literal remains, whether or not the remaining literal is reusable is discriminated (step 1010).

If it is discriminated in the step 1010 that the literal is reusable, a code using the reuse register as the value of the literal is outputted (step 1011), and the reuse flag is hoisted (step 1012), and a code for executing an logical OR between the literals is outputted and the processing returns to the step 1009 (step 1017).

If it is discriminated in the step 1010 that the literal is not reusable, a code for loading the value of the literal from a memory is outputted (step 1013). Further, whether or not the literal is a negative logic is discriminated (step 1014). If the literal is the negative logic, a code for inverting the value of the loaded literal is outputted (step 1015). After the reuse flag is hoisted, the processing returns to the step 1017 (step 1016).

If it is discriminated in the step 1014 that the literal is not the negative logic, the processing returns to the step 1017.

Figure 14:
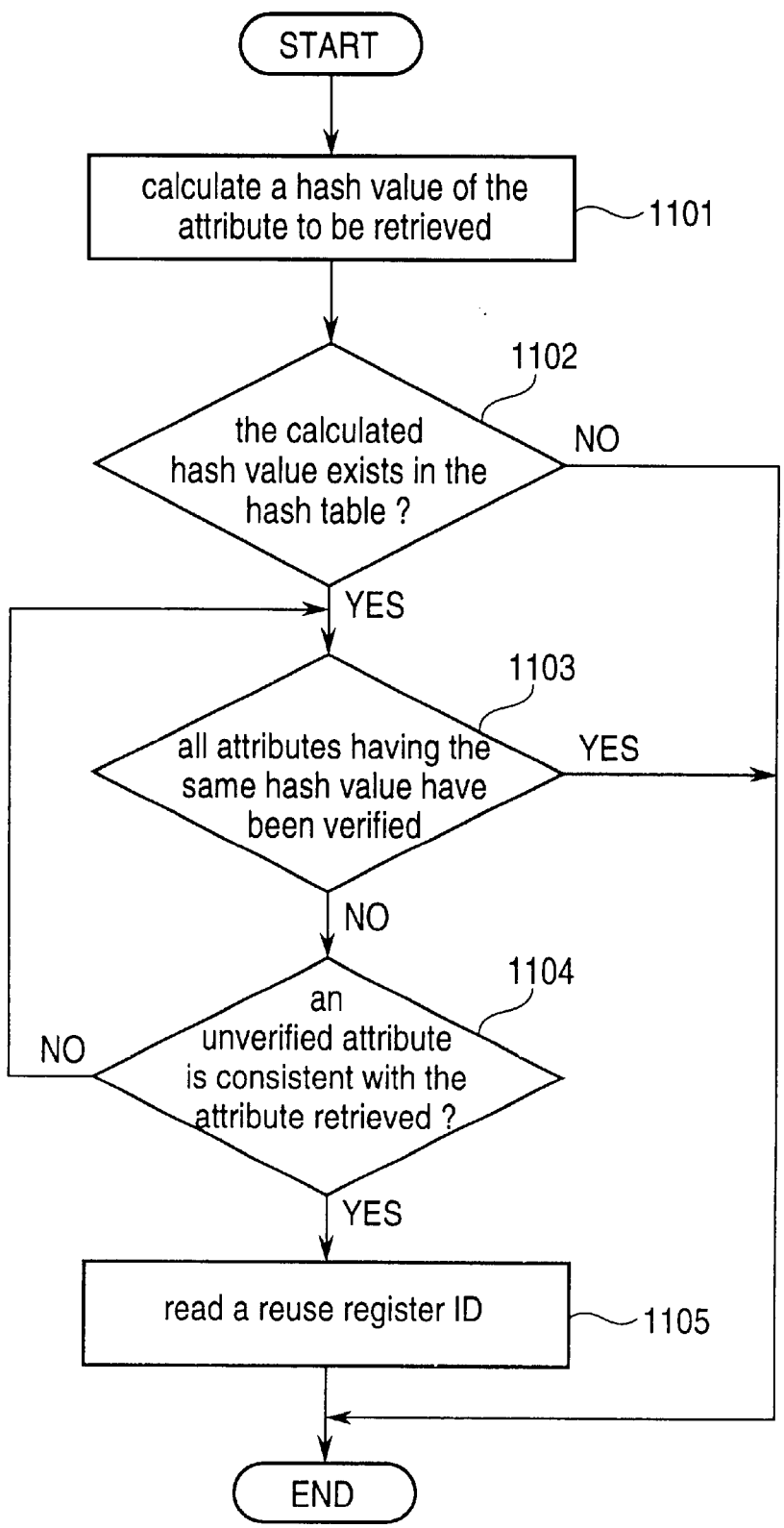
FIG. 14 is a flow chart for illustrating a processing for discriminating whether or not the logical expression, the cube and the literal are reusable (steps 1002, 1006 and 1010), in the flow chart of FIG. 13.

Next, the processing (steps 1002, 1006 and 1010) for discriminating whether or not the logical expression, the cube and the literal are reusable, in the flow chart of FIG. 13, will be described with reference to the flow chart of FIG. 14.

First, the hash value of the attribute to be retrieved is calculated (step 1101). Whether or not the calculated hash value exists in the hash table is discriminated, and if it is discriminated that the calculated hash value does not exist, the whole processing is terminated (step 1102).

If it is discriminated in the step 1102 that the calculated hash value exists, whether or not the attribute having the same hash value has been verified is discriminated. If it is discriminated that all attributes having the same hash have been verified, the whole processing is terminated (step 1103).

If it is discriminated in the step 1103 that an unverified attribute remains, whether or not the unverified attribute is consistent with the attribute being retrieved, is discriminated. If it is not consistent, the processing returns to the step 1103 (step 1104).

It is discriminated in the step 1104 that the unverified attribute is consistent with the attribute being retrieved, the reuse register ID is read out and the whole processing is terminated (step 1105).

Figure 15:
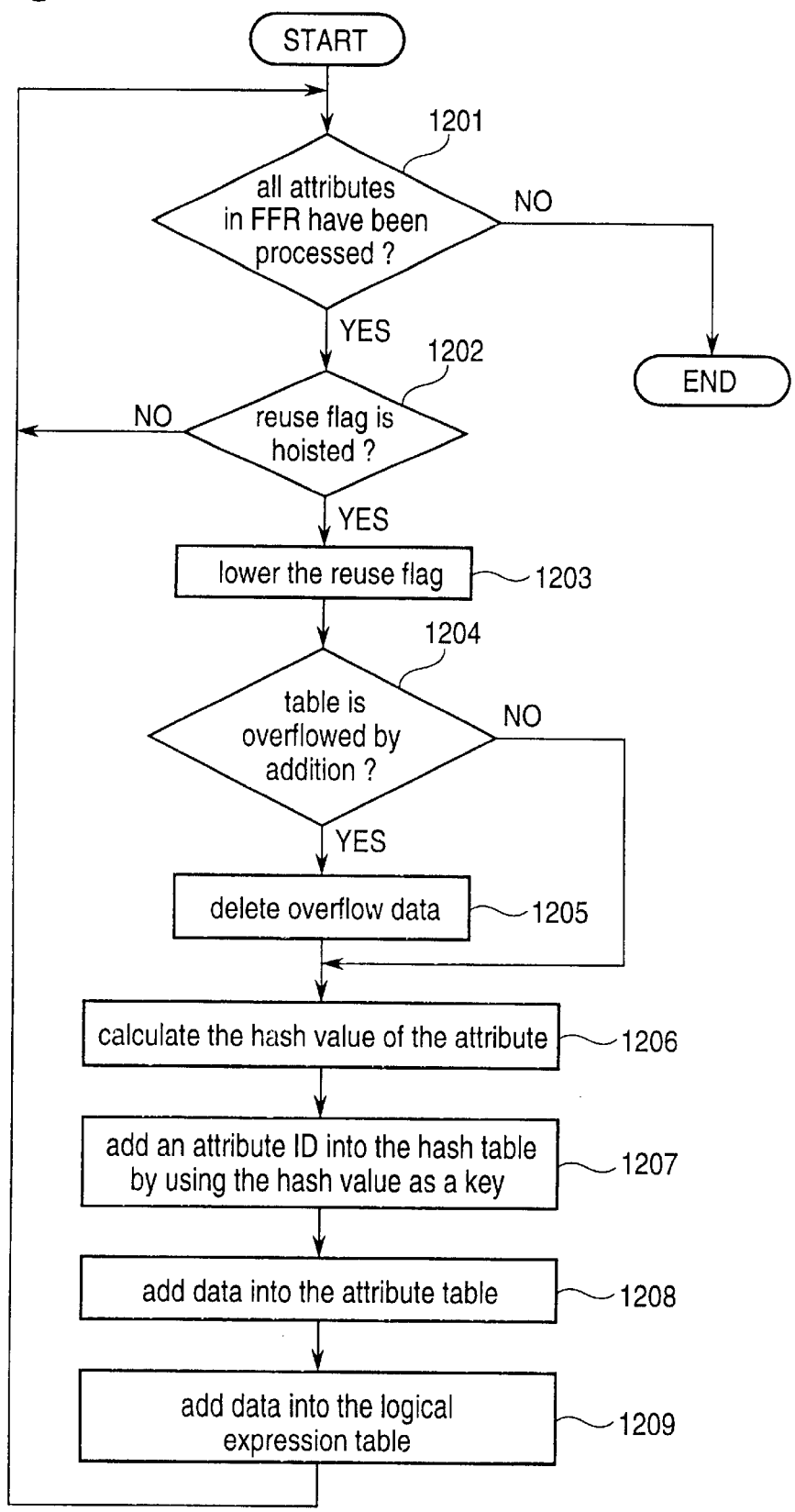
FIG. 15 is a flow chart for illustrating a processing for registering the attribute of the FFR (step 908), in the flow chart of FIG. 12.

Further, the processing (step 908) for registering the attribute of the FFR, in the flow chart of FIG. 12, will be described with reference to the flow chart of FIG. 15.

First, whether or not all attributes in FFR have been processed is discriminated. If it is discriminated that all attributes in FFR have been processed, the whole processing is terminated (step 1201).

If it is discriminated in the step 1201 that an unprocessed attribute remains, whether or not the reuse flag is hoisted is discriminated. If the reuse flag is not hoisted, the processing returns to the step 1201 (step 1202).

If it is discriminated in the step 1202 that the reuse flag is hoisted, the reuse flag is lowered (step 1203), and then, whether or not the table will be overflowed by addition is discriminated (step 1204).

If it is discriminated in the step 1204 that the table will overflow, data corresponding to an overflow amount is deleted, and the processing goes to a step 1206 (step 1205). If it is discriminated in the step 1204 that the table will not be overflow, the processing goes directly to the step 1206.

Then, the hash value of the attribute is calculated (step 1206), and the attribute ID is added into the hash table by using the obtained hash value as the key (step 1207). Furthermore, data is added into the attribute table (step 1208), and data is added into the logical expression table and the processing returns to the step 1201 (step 1209).

This embodiment of the method for preparing the logic simulation mode, is so configured that elements extracted from the logical expression in the logic optimization for the logic synthesis are used also for the optimization of the program code.

To read data from a memory to a register, a long time is required in comparison with the case of reading data from a register. Therefore, a time required for transferring data from one register to another becomes shorter than a time required for transferring data from a memory to a register. Accordingly, the method of this embodiment optimizing the program code by using the data held in the registers, can make the processing time shorter than that required in the prior art method optimizing the program code by reading data from a memory.

In addition, since the optimization is carried out without analyzing the program code, the amount of memory being used can be reduced.

Although not shown in the drawings, a system for executing the embodiment of the method for preparing the logic simulation mode, includes a recording medium storing a program. The recording medium may be a magnetic disk, a semiconductor memory, or another type recording medium.

This program is loaded from the recording medium into a system for executing the preparation of the logic simulation model, and controls an operation of the system. Thus, the system is program-controlled to execute the above mentioned method for preparing the logic simulation model.

As mentioned above, the present invention has an advantage that, since it is possible to omit the step of analyzing the program code, by utilizing, in the process for optimizing the program code, information of elements obtained in the logic optimization for the logic synthesis, the processing speed in the process for preparing the logic simulation model can be elevated, and also, the amount of memory being used can be reduced.

What is claimed is:

1. A method for preparing a logic simulation model, comprising:

extracting a logic block from a verified logic circuit information and executing a logic synthesis of optimizing the logic of said logic block;

converting the optimized logic block into a program code and optimizing said program code; and converting the optimized program code into a simulation model object, wherein elements of a logical expression indicating a logical representation of said logic block, generated in said executing a logic synthesis, are retained as reusable elements, and said reusable elements are used in said optimizing the logic of said logic block.

2. A method in claim 1 wherein said reusable elements include respective input variables, main terms, a minimum logical-OR form, and a cover condition of said logical expression.

3. A recording medium storing a program for causing a computer to execute:
- a process for extracting a logic block from a verified logic circuit information and executing a logic synthesis of optimizing the logic of said logic block;
- a process for retaining elements of a logical expression indicating a logical representation of said logic block, generated in said processing for executing said logic synthesis, as reusable elements;
- a process for converting the optimized logic block into a program code and optimizing said program code by using said reusable elements; and
- a process for converting the optimized program code into a simulation model object.

4. A recording medium claimed in claim 3 wherein said reusable elements include respective input variables, main terms, a minimum logical-OR form, and a cover condition of said logical expression.

5. A system for preparing a logic simulation model, comprising:
- a logic synthesis means for extracting a logic block from a verified logic circuit information and executing a logic synthesis of optimizing the logic of said logic block;
- an optimizing means for converting the optimized logic block into a program code and optimizing said program code; and
- a converting means for converting the optimized program code into a simulation model object,
- wherein said logic synthesis means retains elements of a logical expression indicating a logical representation of said logic block, generated when said logic synthesis is executed, as reusable elements, and said optimizing means uses said reusable elements for optimizing said program code.

6. A system claimed in claim 5 wherein said reusable elements include respective input variables, main terms, a minimum logical-OR form, and a cover condition of said logical expression.

* * * * *